(12) United States Patent
Kim

(10) Patent No.: US 8,890,576 B2
(45) Date of Patent: Nov. 18, 2014

(54) INPUT/OUTPUT SENSE AMPLIFIER

(71) Applicant: SK Hynix Inc., Icheon-si (KR)

(72) Inventor: Jong Su Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/731,325

(22) Filed: Dec. 31, 2012

(65) Prior Publication Data

US 2014/0062598 A1  Mar. 6, 2014

(30) Foreign Application Priority Data

Aug. 29, 2012  (KR) ........................ 10-2012-0095167

(51) Int. Cl.
  *G01R 19/00* (2006.01)
  *G11C 7/00* (2006.01)
(52) U.S. Cl.
  USPC ................................ 327/52; 327/55; 327/57

(58) Field of Classification Search
  USPC ....................................................... 327/52–57
  See application file for complete search history.

(56) References Cited

U.S. PATENT DOCUMENTS

| 4,675,544 | A | | 6/1987 | Schrenk |
| 6,088,278 | A | * | 7/2000 | Porter et al. .................. 365/208 |
| 6,483,351 | B2 | * | 11/2002 | Sim ................................. 327/52 |
| 8,559,240 | B2 | * | 10/2013 | Hong et al. .............. 365/189.05 |

FOREIGN PATENT DOCUMENTS

| KR | 100271651 B1 | 8/2000 |
| KR | 1020020091618 A | 12/2002 |

* cited by examiner

*Primary Examiner* — Kenneth B. Wells
(74) *Attorney, Agent, or Firm* — William Park & Associates Patent Ltd.

(57) ABSTRACT

An input/output sense amplifier includes: a data input unit configured to amplify data using a driving voltage and to output the amplified data, and a latch unit configured to latch and output an output signal of the data input unit to an output terminal.

15 Claims, 3 Drawing Sheets

INPUT/OUTPUT SENSE AMPLIFIER

CROSS-REFERENCES TO RELATED APPLICATION

The present application claims priority under 35 U.S.C. §119(a) to Korean application number 10-2012-0095167, filed on Aug. 29, 2012, in the Korean Intellectual Property Office, which is incorporated herein by reference in its entirety.

BACKGROUND

1. Technical Field

The present invention relates generally to a semiconductor device, and more particularly, to an input/output sense amplifier of a semiconductor device.

2. Related Art

FIG. 1 is a diagram illustrating the configuration of a conventional input/output sense amplifier 10.

The following description will be given with respect to the conventional input/output sense amplifier 10 with reference to FIG. 1. The conventional input/output sense amplifier 10 includes a latch unit 11, a precharge unit 12, and a data input unit 13. The latch unit 11 includes a first PMOS transistor P1 which is connected between a driving voltage VDD and a first node n1 and receives an output signal of a second node n2, a second PMOS transistor P2 which is connected between the driving voltage VDD and the second node n2 and receives an output signal of the first node n1, a first NMOS transistor N1 which is connected between the first node n1 and a third node n3 and receives the output signal of the second node n2, and a second NMOS transistor N2 which is connected between the second node n2 and a fourth node n4 and receives the output signal of the first node n1. The first node n1 is connected to a second output terminal OUTB, and the second node n2 is connected to a first output terminal OUT.

The precharge unit 12 includes a third PMOS transistor P3 which is connected between the driving voltage VDD and the first node n1 and receives a strobe signal STB, a fourth PMOS transistor P4 which is connected between the driving voltage VDD and the second node n2 and receives the strobe signal STB, and a fifth PMOS transistor P5 which is connected between the first node n1 and the second node n2 and receives the strobe signal STB.

The data input unit 13 includes a third NMOS transistor N3 which is connected between the third node n3 and a fifth node n5 and receives an output signal of a first local transmission line LIO, a fourth NMOS transistor N4 which is connected between the third node n3 and the fifth node n5 and receives an output signal of a second local transmission line LIOB, and a fifth NMOS transistor N5 which is connected between the fifth node n5 and a ground voltage VSS and receives the strobe signal STB.

The operation of the conventional input/output sense amplifier 10 is as follows. During a read operation, the strobe signal STB is enabled, and when data is input through the first and second local transmission lines LIO and LIOB, the data is amplified and transmitted to the first and second output terminals OUT and OUTB.

In the conventional input/output sense amplifier 10, a voltage drop phenomenon occurs in which the voltage of the third node n3 and fourth node n4 is lower than a precharge voltage level because of impedance caused by the transistors in the input/output sense amplifier 10. This leads to deteriorated operational characteristics of the input/output sense amplifier 10.

SUMMARY

In an embodiment of the present invention, an input/output sense amplifier includes: a data input unit configured to amplify data using a driving voltage and to output the amplified data, and a latch unit configured to latch and output an output signal of the data input unit to an output terminal.

In another embodiment of the present invention, an input/output sense amplifier includes: a data input unit configured to amplify data using a driving voltage and to output the amplified data to first and second nodes, and a latch unit connected to the first and second nodes and configured to latch and output an output signal of the data input unit to an output terminal.

BRIEF DESCRIPTION OF THE DRAWINGS

Features, aspects, and embodiments are described in conjunction with the attached drawings, in which.

DETAILED DESCRIPTION

Hereinafter, an input/output sense amplifier according to the present invention will be described below with reference to the accompanying drawings through various embodiments.

Figure 2:
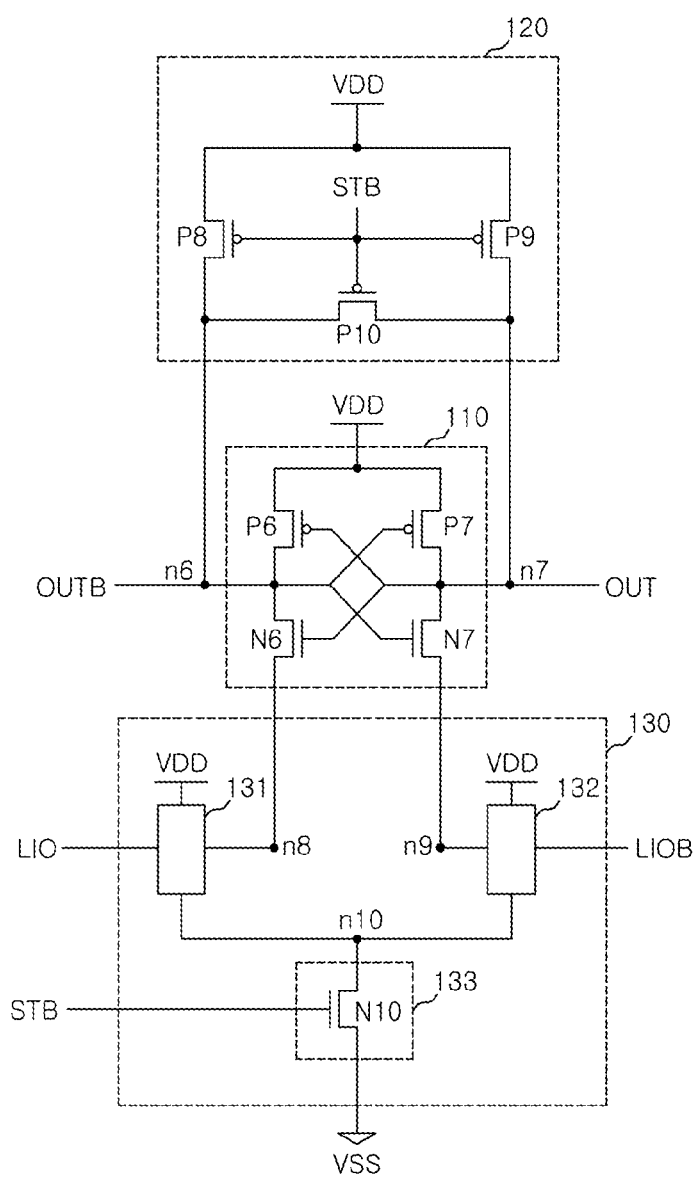
FIG. 2 is a circuit diagram illustrating the configuration of an input/output sense amplifier according to an embodiment of the present invention.

FIG. 2 is a circuit diagram illustrating the configuration of an input/output sense amplifier 100 according to an embodiment of the present invention.

The following description will be given with respect to the input/output sense amplifier 100 according to an embodiment of the present invention with reference to FIG. 2.

The input/output sense amplifier 100 according to an embodiment of the present invention includes a latch unit 110, a precharge unit 120, and a data input unit 130.

The data input unit 130 includes a first buffer unit 131, a second buffer unit 132, and a sink unit 133.

The latch unit 110 includes a sixth PMOS transistor P6 which is connected between a driving voltage VDD and a sixth node n6 and receives an output signal of a seventh node n7, a seventh PMOS transistor P7 which is connected between the driving voltage VDD and the seventh node n7 and receives an output signal of the sixth node n6, a sixth NMOS transistor N6 which is connected between the sixth node n6 and an eighth node n8 and receives the output signal of the seventh node n7, and a seventh NMOS transistor N7 which is connected between the seventh node n7 and a ninth node n9 and receives the output signal of the sixth node n6. The sixth node n6 is connected to a second output terminal OUTB, and the seventh node n7 is connected to a first output terminal OUT.

The precharge unit 120 includes an eighth PMOS transistor P8 which is connected between the driving voltage VDD and the sixth node n6 and receives a strobe signal STB, a ninth PMOS transistor P9 which is connected between the driving voltage VDD and the seventh node n7 and receives the strobe signal STB, and a tenth PMOS transistor P10 which is connected between the sixth node n6 and the seventh node n7 and receives the strobe signal STB.

The data input unit 130 is connected between the driving voltage VDD and a ground voltage VSS, and outputs data, which is inputted through a first local transmission line LIO and a second local transmission line LIOB, to the eighth node n8 and the ninth node n9.

The eighth node n8 and the ninth node n9 are connected to the latch unit 110 to transfer data received through the data input unit 130 to the latch unit 110.

The data input unit 130 includes: the first buffer unit 131 which is connected between the tenth node n10 and the driving voltage VDD, and receives and transmits an output signal of the first local transmission line LIO to the eighth node n8, and the second buffer unit 132 which is connected between the tenth node n10 and the driving voltage VDD, and receives and transmits an output signal of the second local transmission line LIOB to the ninth node n9. The sink unit 133 includes the tenth NMOS transistor N10, which is connected between the tenth node n10 and the ground voltage VSS, and receives the strobe signal STB. The sink unit 133 allows current to flow toward the ground voltage VSS in response to an enabled strobe signal STB.

The strobe signal STB is a read operation control signal generated with a combination of instructions including a chip select signal CS, a low address strobe signal RAS, a column address strobe signal CAS, and a write enable signal WE. The strobe signal STB is enabled when a semiconductor device performs a read operation, wherein according to an embodiment of the present invention, the enabled state of the strobe signal STB corresponds to logic high. The strobe signal STB is thus disabled when the semiconductor device does not perform a read operation, wherein according to an embodiment of the present invention, the disabled state of the strobe signal STB corresponds to a logic low.

Figure 1:
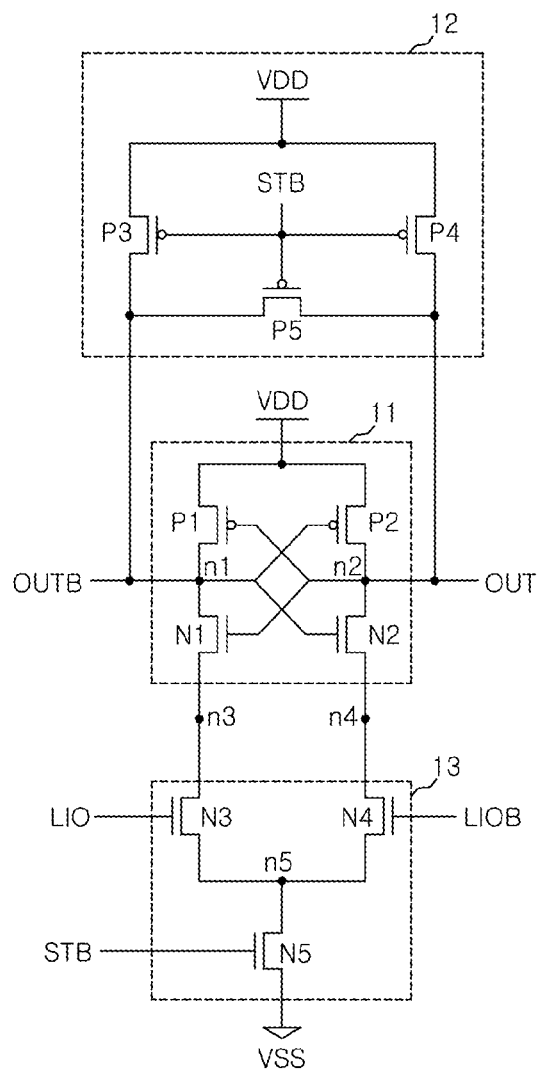
FIG. 1 is a circuit diagram illustrating the configuration of a conventional input/output sense amplifier.

Referring to FIGS. 1 and 2, the input/output sense amplifier 100 according to an embodiment of the present invention and the conventional input/output sense amplifier 10 will be compared with each other to bring clarity to their differences.

The data input unit 130 of the input/output sense amplifier 100 according to an embodiment of the present invention amplifies data inputted through the first and second local transmission lines LIO and LIOB using the driving voltage VDD, and transfers the amplified data to the latch unit 110.

When the strobe signal STB is in a disabled state, the latch unit 110 receives a precharge voltage having the level of the driving voltage VDD, which is outputted from the precharge unit 120, at the sixth node n6 and seventh node n7. However, due to the impedance characteristics of the transistors included in the input/output sense amplifier 100, a voltage drop phenomenon occurs in regards to the precharge voltage.

In the conventional input/output sense amplifier 10, the voltage drop phenomenon of the precharge voltage increases the time period required for the input/output sense amplifier 10 to amplify a signal. However, since the data input unit 130 according to an embodiment of the present invention uses the driving voltage VDD to amplify data which is inputted through the first and second local transmission lines LIO and LIOB, it is possible to compensate for the voltage drop phenomenon of the precharge voltage.

Figure 3A:
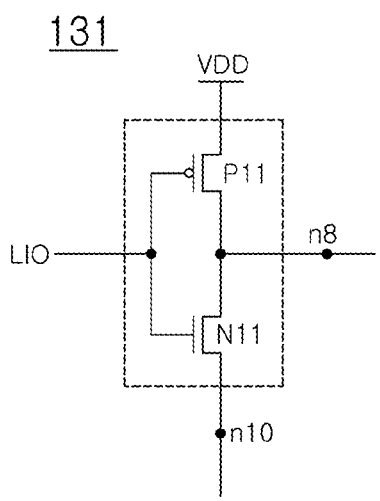
FIGS. 3A and 3B are circuit diagrams illustrating the configurations of the first and second buffer units of FIG. 2.
Figure 3B:
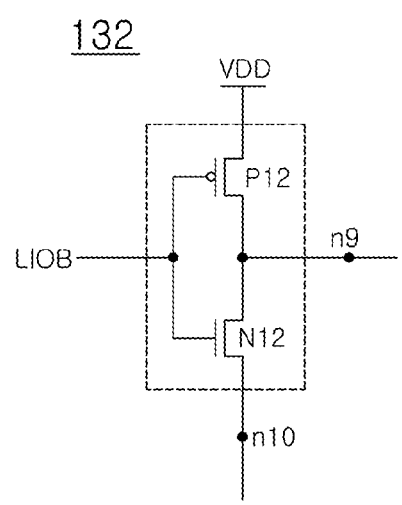

FIGS. 3A and 3B are circuit diagrams illustrating the configurations of the first buffer unit 131 and the second buffer unit 132 of FIG. 2.

The first buffer unit 131 includes an eleventh PMOS transistor P11 which is connected between the driving voltage VDD and the eighth node n8 and receives data through the first local transmission line LIO, and an eleventh NMOS transistor N11 which is connected between the eighth node n8 and the tenth node n10 and receives data through the first local transmission line LIO.

The second buffer unit 132 includes a twelfth PMOS transistor P12 which is connected between the driving voltage VDD and the ninth node n9 and receives data through the second local transmission line LIOB, and a twelfth NMOS transistor N12 which is connected between the ninth node n9 and the tenth node n10 and receives data through the second local transmission line LIOB. That is, the first and second buffer units 131 and 132 may be an inverter structure, as it is well known.

The first and second buffer units 131 and 132 amplifies data, which is transmitted through the first and second local transmission lines LIO and LIOB, using the driving voltage VDD, and transmits the amplified data to the latch unit 110. In other words, the first and second buffer units 131 and 132 buffers and transfers data to the input/output sense amplifier 100, so that a sensing margin of the input/output sense amplifier 100 can be ensured despite the voltage drop phenomenon of a precharge voltage that occurs in the latch unit 110.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. An input/output sense amplifier comprising:
a data input unit configured to amplify data through inverters and to output the amplified data; and
a latch unit configured to receive the amplified data and configured to latch and output an output signal of the data input unit to an output terminal,
wherein the data input unit comprises:
a first inverter configured to amplify the data, which is inputted through a first local transmission line, using a driving voltage, and to output the amplified data;
a second inverter configured to amplify the data, which is inputted through a second local transmission line, using the driving voltage, and to output the amplified data; and
a sink unit connected to the first and second buffer units and configured to allow current to flow toward a ground voltage in response to the strobe signal,
wherein the first inverter comprises;
a first PMOS transistor connected to a driving voltage terminal; and
first NMOS transistor connected between the first PMOS transistor and the sink unit,
wherein the first PMOS transistor and the first NMOS transistor are driven in response to the data and a connecting node between the first PMOS transistor and the first NMOS transistor is connected to the latch unit.

2. The input/output sense amplifier according to claim 1, further comprising a precharge unit configured to supply a precharge voltage to the output terminal in response to a strobe signal.

3. The input/output sense amplifier according to claim 1, wherein the sink unit comprises an NMOS transistor.

4. The input/output sense amplifier according to claim 3, wherein the sink unit receives the strobe signal.

5. The input/output sense amplifier according to claim 1, wherein the second inverter comprises:
   a second PMOS transistor connected to a driving voltage terminal; and
   a second NMOS transistor connected between the second PMOS transistor and the sink unit,
   wherein the second PMOS transistor and the second NMOS transistor are driven in response to the data and a connecting node between the second PMOS transistor and the second NMOS transistor is connected to the latch unit.

6. An input/output sense amplifier comprising:
   a data input unit configured to amplify data using a driving voltage and to output the amplified data to first and second nodes; and
   a latch unit connected to the first and second nodes and configured to latch and output an output signal of the data input unit to an output terminal,
   wherein the data input unit comprises:
      a first inverter configured to amplify the data, which is inputted through a first local transmission line, using the driving voltage, and to output the amplified data to the first node; and
      a second inverter configured to amplify the data, which is inputted through a second local transmission line, using the driving voltage, and to output the amplified data to the second node,
      wherein the first inverter comprises:
         a first PMOS transistor connected between the driving voltage and the first node and configured to receive the data; and
         a first NMOS transistor connected between the first node and the sink unit, and configured to receive the data.

7. The input/output sense amplifier according to claim 6, further comprising a precharge unit configured to supply a precharge voltage to the output terminal in response to a strobe signal.

8. The input/output sense amplifier according to claim 7, wherein the data input unit further comprises:
   a sink unit connected to the first and second inverters and configured to allow current to flow toward a ground voltage in response to the strobe signal.

9. The input/output sense amplifier according to claim 6, wherein the second inverter comprises:
   a second PMOS transistor connected between the driving voltage and the second node, and configured to receive the data; and
   a second NMOS transistor connected between the second node and the sink unit, and configured to receive the data.

10. The input/output sense amplifier according to claim 8, wherein the sink unit comprises an NMOS transistor.

11. The input/output sense amplifier according to claim 10, wherein the sink unit receives the strobe signal.

12. An input/output sense amplifier comprising:
   a data input unit connected between a driving voltage and a ground voltage and configured to amplify data using the driving voltage and to output the amplified data; and
   a latch unit configured to receive the amplified data at their source terminal and configured to latch and output the amplified data to an output terminal,
   wherein the data input unit is configured to output the amplified data to first and second nodes which are connected to the source terminal of the latch unit, and
   wherein the data input unit comprises:
   a first buffer unit including a first PMOS transistor connected between the driving voltage and the first node, and configured to receive the data, and a first NMOS transistor connected to the first node, and configured to receive the data, and
   a second buffer unit including a second PMOS transistor connected between the driving voltage and the second node, and configured to receive the data, and a second NMOS transistor connected to the second node, and configured to receive the data.

13. The input/output sense amplifier according to claim 12, wherein the data input unit further comprises:
   a sink unit connected between a third node and the ground voltage and configured to allow current to flow toward the ground voltage in response to the strobe signal,
   wherein the third node is a node for connecting a source of the first NMOS transistor with a source of the second NMOS transistor.

14. The input/output sense amplifier according to claim 13, wherein the sink unit comprises an NMOS transistor.

15. The input/output sense amplifier according to claim 14, wherein the sink unit receives the strobe signal.

* * * * *